(12) United States Patent
Fukui

(10) Patent No.: US 6,271,075 B1
(45) Date of Patent: Aug. 7, 2001

(54) METHOD OF MANUFACTURING SEMICONDUCTOR DEVICE WHICH CAN REDUCE MANUFACTURING COST WITHOUT DROPPING PERFORMANCE OF LOGIC MIXED DRAM

(75) Inventor: Kozo Fukui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/535,981

(22) Filed: Mar. 27, 2000

(30) Foreign Application Priority Data

Mar. 30, 1999 (JP) .................................................. 11-088239

(51) Int. Cl.[7] .............................................. H01L 21/8242
(52) U.S. Cl. ......................... 438/239; 438/253; 438/672; 438/682
(58) Field of Search ........................... 438/238, 240–256, 438/381, 386–399, 672, 682

(56) References Cited

U.S. PATENT DOCUMENTS

| 5,998,257 | * | 12/1999 | Lane et al. | ............................ 438/253 |
| 6,051,462 | * | 4/2000 | Ohno | .................................. 438/241 |

FOREIGN PATENT DOCUMENTS

| 3-8339 | 1/1991 | (JP) . |
| 4-590 | 1/1992 | (JP) . |

* cited by examiner

*Primary Examiner*—Jey Tsai
(74) *Attorney, Agent, or Firm*—Young & Thompson

(57) ABSTRACT

A method of manufacturing a semiconductor device, includes a providing step, a forming step, and a removing step. The providing step includes providing a DRAM section and a logic section in a substrate. The forming step includes forming a first silicide layer in the DRAM section and a second silicide layer in the logic section. The removing step includes removing the first silicide layer.

23 Claims, 7 Drawing Sheets

METHOD OF MANUFACTURING
SEMICONDUCTOR DEVICE WHICH CAN
REDUCE MANUFACTURING COST
WITHOUT DROPPING PERFORMANCE OF
LOGIC MIXED DRAM

BACKGROUND OF THE INVENTION

1. Field of the Invention

The present invention relates to a method of manufacturing a semiconductor device. More particularly, the present invention relates to a method of manufacturing a semiconductor device which can reduce a manufacturing cost without dropping a performance of a logic-mixed-DRAM.

2. Description of the Related Art

A logic-mixed-DRAM (logic in DRAM) semiconductor device is a device essential to making a performance of a system higher. Especially, a performance of a logic section of the logic-mixed-DRAM semiconductor device is an element having influence on the performance of the system. So, it is important to maintain the logic section in a high performance.

In the logic-mixed-DRAM semiconductor device, in order to maintain the performance of the logic section, it is necessary to form a silicide layer in a part of a diffusion layer of the logic section to thereby drop a contact resistance. On the other hand, in a DRAM section of the logic-mixed-DRAM semiconductor device, it is not necessary to form a silicide layer in a part of a diffusion layer of the DRAM section.

For this reason, conventionally, silicide block PR (photo resist) (not shown) is formed in the DRAM section so that the silicide layer is not formed in the diffusion layer of the DRAM section and the silicide layer is formed in the diffusion layer of the logic section, after the formation of a gate polysilicon layer.

As mentioned above, although the logic-mixed-DRAM semiconductor device is valuable to making the performance of the system higher, it is impossible to avoid the increase of a manufacturing cost resulting from the mixture of the DRAM and the logic. Thus, it is desirable to reduce the cost without dropping the performance of the system.

Japanese Laid Open Patent Application (JP-A-Heisei 3-8339) discloses the following method of manufacturing a semiconductor device. The method of manufacturing a semiconductor device in which a wiring and a p-type impurity region formed on a semiconductor substrate are connected is characterized in that the method comprises: a step of selectively removing an insulating film formed on the semiconductor substrate and then forming a contact region; a step of forming a wiring layer, in which a high temperature melting point metallic silicon compound layer is laminated on a polysilicon layer, on the semiconductor substrate so as to cover the contact region; a step of patterning the wiring layer; and a step of selectively removing the high temperature melting point metallic silicon compound layer on the contact region.

Japanese Examined Patent Application (JP-B-Heisei 4-590) discloses the following method of manufacturing a bipolar type of semiconductor device. The method is characterized in that it comprises: a step of forming a lamination film pattern of a metallic silicide film and a non-mono-crystal silicon film on a part of a first conductive type of semiconductor layer; a step of doping this lamination film pattern with a second conductive type of impurity layer; a step of etching and removing only the metallic silicide film by using an etching method having a selection for metallic silicide, in a portion of the lamination film pattern, and accordingly exposing the non-mono-crystal silicon film in the portion; a step of oxidizing the exposed portion of this non-mono-crystal silicon film and thereby forming a fetching electrode; a step of diffusing the impurity from the fetching electrode into the first conductive type of semiconductor layer through a heat treatment, and thereby forming a second conductive type of high concentration impurity region; a step of selectively doping the first conductive type of semiconductor layer from an oxide region of the non-mono-crystal silicon film with a second conductive type of impurity, and thereby forming a second conductive type of low concentration impurity region adjacent to the second conductive type of high concentration impurity region; a step of leaving an insulating film in a side wall of the fetching electrode by performing an anisotropy etching on an insulating film after deposition of an insulating film to cover the fetching electrode; and a step of forming a first conductive of high concentration impurity region in the second conductive type of low concentration impurity region.

SUMMARY OF THE INVENTION

The present invention has been made to solve the above-described problems of the conventional a method of manufacturing a semiconductor device. An object of the present invention is to provide a method of manufacturing a semiconductor device, which can reduce a cost without dropping a performance of the device. Another object of the present invention is to provide a method of manufacturing a semiconductor device having a logic section and a DRAM section, which can reduce a cost without dropping a performance of the device.

In order to achieve an aspect of the present invention, a method of manufacturing a semiconductor device, includes (a) providing a DRAM section and a logic section in a substrate, (b) forming a first silicide layer in the DRAM section and a second silicide layer in the logic section, and (c) removing the first silicide layer.

In this case, a method of manufacturing a semiconductor device, further includes (d) forming a gate layer on the DRAM section, and (e) forming a side wall in a side portion of the gate layer, and wherein the (c) step is performed after the (e) step is performed such that the first silicide layer is removed in self alignment process.

In this case, the (c) step includes performing ion implantation on the first silicide layer.

Also in this case, the ion implantation is performed to change the first silicide layer to amorphous.

Further in this case, the (c) step includes removing the first silicide layer changed to amorphous by wet etching.

In this case, when the implanted ion is arsenic, the ion implantation is performed in a condition that an implantation energy of the ion is 20 to 50 KeV and a dose amount is $1\times10^{14}$ to $1\times10^{15}$.

Also in this case, when the implanted ion is phosphorus, the ion implantation is performed in a condition that an implantation energy of the ion is 20 to 50 KeV and a dose amount is $1\times10^{14}$ to $5\times10^{15}$.

In order to achieve another aspect of the present invention, a method of manufacturing a semiconductor device, includes (f) providing a DRAM section and a logic section in a substrate, (g) forming a first diffusion layer in the DRAM section and a second diffusion layer in the logic section, (h) forming a first silicide layer in the first diffusion layer and a second silicide layer in the second diffusion layer, (i) removing the first silicide layer to expose the first diffusion layer, and (j) forming a contact plug such that the contact plug is connected to the exposed first diffusion layer directly.

In this case, the (i) step includes removing the first silicide layer such that the first silicide layer corresponding to a lower portion of the contact plug is removed in self alignment process.

Also in this case, the (h) step includes forming the first silicide layer in the first diffusion layer, without using a silicide block masking the first diffusion layer not to form a silicide layer in the first diffusion layer.

Further in this case, a method of manufacturing a semiconductor device, further includes (k) forming an interlayer insulating layer on the first silicide layer, (l) forming a contact hole in a portion corresponding to the contact plug, of the interlayer insulating layer, and (m) forming a side wall on an inner surface of the contact hole to form a second contact hole, and wherein the (i) step includes removing the first silicide layer exposed through the second contact hole in self alignment process.

In this case, the (j) step includes forming the contact plug in the second contact hole.

Also in this case, the (i) step includes removing the first silicide layer by wet etching such that the side wall is not removed by the wet etching.

Further in this case, the wet etching is performed to remove a native oxide on a bottom surface of the second contact hole.

In this case, the (i) step includes performing ion implantation on the first silicide layer exposed through the second contact hole.

Also in this case, the ion implantation is performed to change to amorphous, the first silicide layer exposed through the second contact hole.

Further in this case, the (i) step includes removing the first silicide layer changed to amorphous by the wet etching.

In this case, the ion implantation is performed to decrease a wet etching resistivity of the first silicide layer exposed through the second contact hole.

Also in this case, the first and second silicide layers are formed of one of cobalt silicide, titanium silicide and tungsten silicide.

Further in this case, a contact resistance of the DRAM section is 5 k to 7 k$\Omega$.

In this case, when the implanted ion is arsenic, the ion implantation is performed in a condition that an implantation energy of the ion is 20 to 50 KeV and a dose amount is $1\times10^{14}$ to $1\times10^{15}$.

Also in this case, when the implanted ion is phosphorus, the ion implantation is performed in a condition that an implantation energy of the ion is 20 to 50 KeV and a dose amount is $1\times10^{14}$ to $5\times10^{15}$.

Since a silicide layer of a DRAM section is formed in the same step as a silicide layer of a logic section. Thus, a step of removing an unnecessary silicide layer of the DRAM section does not increase the number of the whole steps caused by the formation of the unnecessary silicide layer of the DRAM section. The number of steps is smaller by 1 than that of the conventional method in which a block layer is formed so that the unnecessary silicide layer is not formed in the DRAM section and later the block layer is removed.

Through such steps, the silicide layer is removed in self-alignment manner (process) by a side wall. The removal of the silicide layer becomes stable, which enables the variation of a product to be reduced.

Changing the silicide to amorphous state can drop the wet etching resistivity of the amorphous silicide layer. The silicide layer in which the wet etching resistivity is dropped is removed by wet etching. By the wet etching, only the silicide layer immediately beneath between the side walls is removed. Thus, the self-alignment performance can be increased to thereby make the performance of a product stable.

In this way, in the semiconductor device having the structure that the diffusion layer of the silicon having the silicide layer on the surface and the polysilicon doped with the impurity are connected to each other, only the silicide layer of contact portion is removed in the self-alignment manner. It is desirable that the silicide is cobalt silicide, titanium silicide, or tungsten silicide. Changing the silicide to the amorphous state causes the wet etching resistivity of the silicide to be dropped. The silicide of the contact portion can be removed in the effective self-alignment manner by washing and pre-treating the silicide before the growth of the polysilicon.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail.

Correspondingly to the drawings, as a method of manufacturing a semiconductor device according to the present invention, steps of manufacturing a DRAM section of a logic-mixed-DRAM semiconductor device are provided.

FIGS. 1 to 7 show the steps of manufacturing the DRAM section of the logic-mixed-DRAM semiconductor device. Steps of manufacturing a logic section of the logic-mixed-DRAM semiconductor device are not shown. The steps of manufacturing the logic section are identical to those of the DRAM section, in principle, except a later-described part.

As mentioned above, in order to maintain the performance of the logic section, it is necessary to form the silicide layer in a part of the diffusion layer of the logic section to thereby drop the contact resistance. In order to minimize an additional cost caused by the mixture of the logic section and the DRAM section, it is desirable to realize commonality of the transistor structures of the logic section and the DRAM section so as to simultaneously form the silicide layer in the diffusion layer of the DRAM section as well as the diffusion layer of the logic section.

Figure 1:
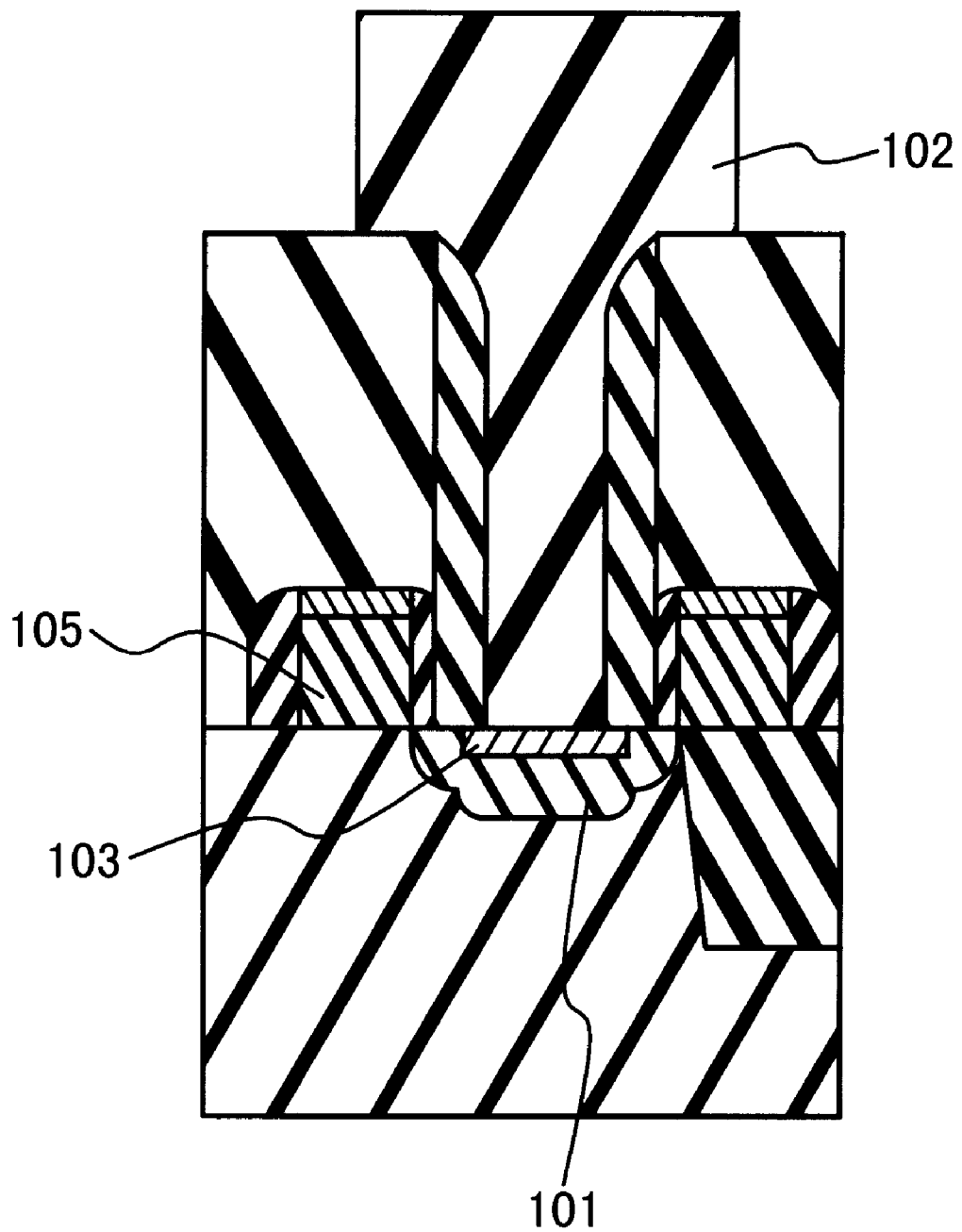
FIG. 1 s a sectional view describing a premise of an embodiment of a method of manufacturing a semiconductor device according to the present invention.

A capacitive element for storing an information is essential in the DRAM section. Usually, this capacitive element has a structure of polysilicon/insulating film/polysilicon. For this reason, if the silicide layer is also formed in the diffusion layer of the DRAM section, this results in a structure that a polysilicon 102 is connected to an upper surface of a diffusion layer 101 in which a silicide layer 103 is formed as shown in FIG. 1.

However, if the polysilicon 102 doped with the impurity is connected to the upper surface of the silicide layer 103, this brings about the generation of phenomenon that the contact resistance is typically high and its variation is large. This phenomenon may result from the generation of a high resistance layer on the bottom surface of the contact caused by dry etching. It is difficult to control this and then manufacture the device. It is the that this is impossible. It is known that such problem can be solved if the diffusion layer 101 and the polysilicon 102 are directly connected to each other.

This embodiment provides a method of removing the suicide layer under plug (polysilicon) in the self-alignment manner in order to connect the diffusion layer and the polysilicon directly to each other, in the DRAM section.

Figure 2:
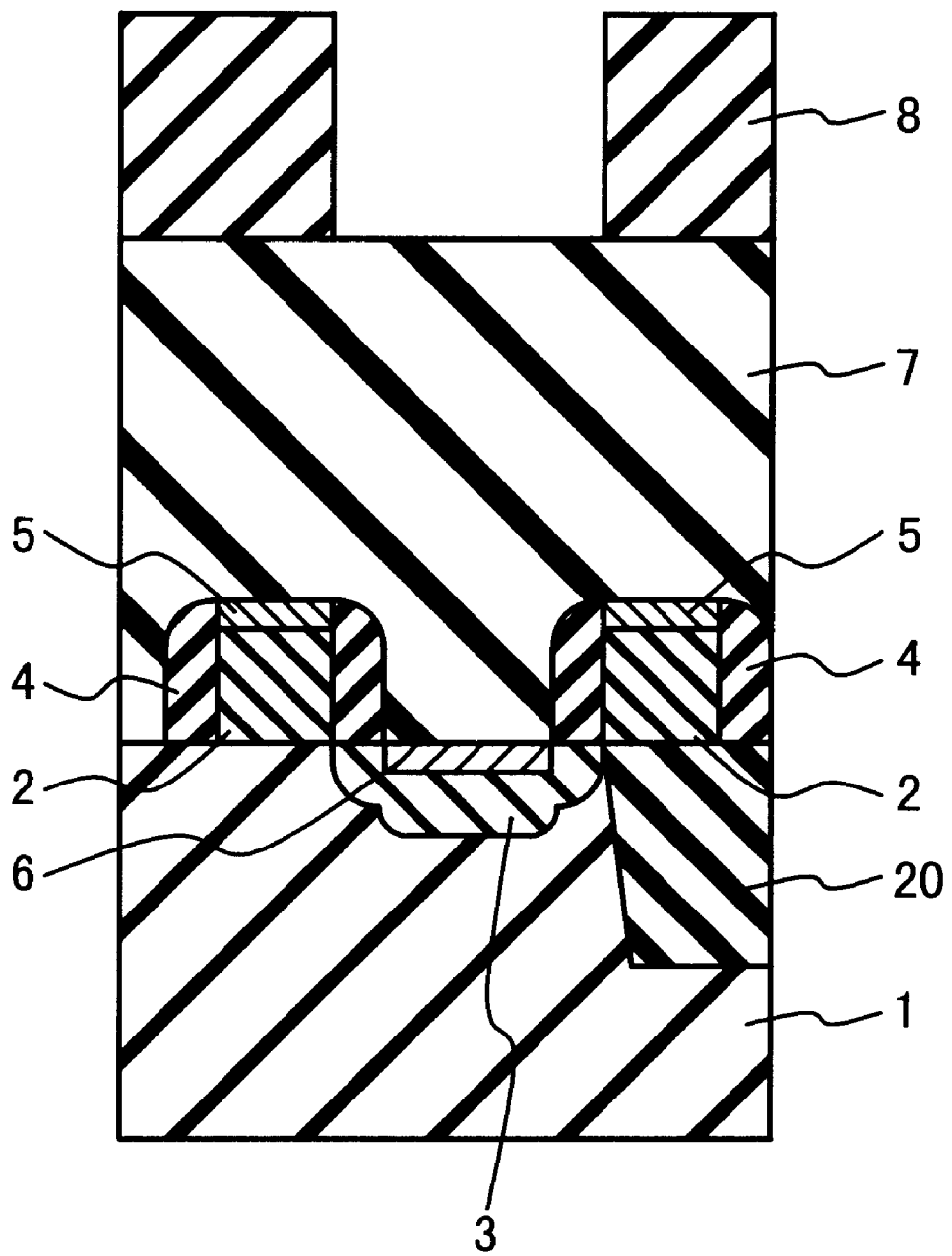
FIG. 2 is a sectional view describing the embodiment of a method of manufacturing a semiconductor device according to the present invention.

As shown in FIG. 2, a polysilicon gate layer 2 is formed on a upper surface of a silicon substrate 1. After a diffusion layer 3 is formed between both the polysilicon gate layers 2, a gate side wall 4 is formed on both sides of the polysilicon gate layer 2. A symbol 20 denotes an element separating region.

A first cobalt silicide layer 5 is formed in a upper portion of the polysilicon gate layer 2, and a second cobalt silicide layer 6 is formed in a upper portion of the diffusion layer 3. Next, an oxide film 7 serving as an interlayer insulating film is formed on upper surfaces of the first cobalt silicide layer 5 and the second cobalt silicide layer 6. In order to form a contact hole in the interlayer insulating film 7, a resist film 8 is formed by using lithography technique.

Figure 3:
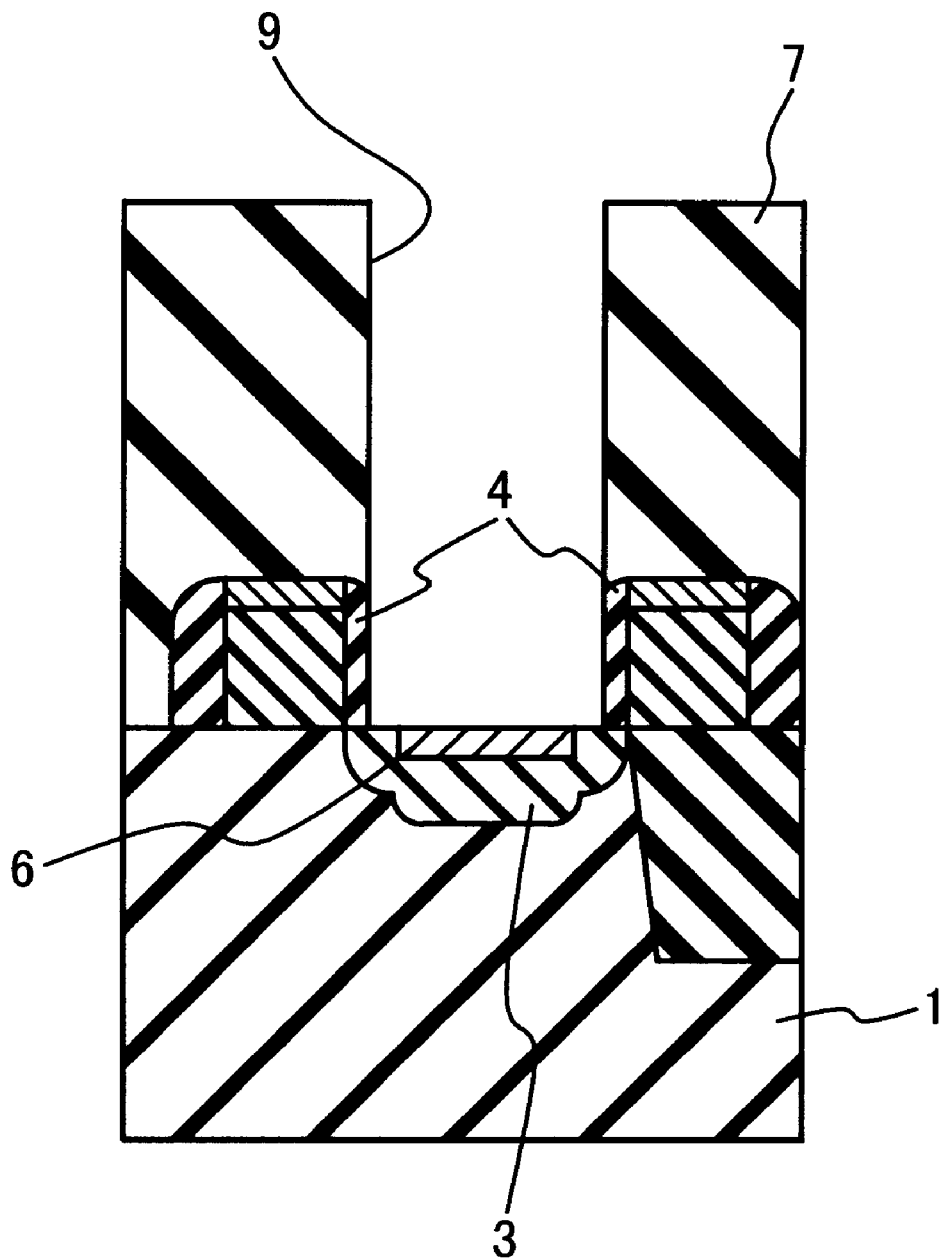
FIG. 3 is a sectional view showing a next step of FIG. 2.

As shown in FIG. 3, a contact hole 9 is formed in the interlayer insulating film 7 by performing the dry etching with the resist film 8 as mask. After that, the resist film 8 is removed. After the formation of the contact hole 9, the second cobalt silicide layer 6 remains on the bottom surface of the contact hole 9.

Figure 4:
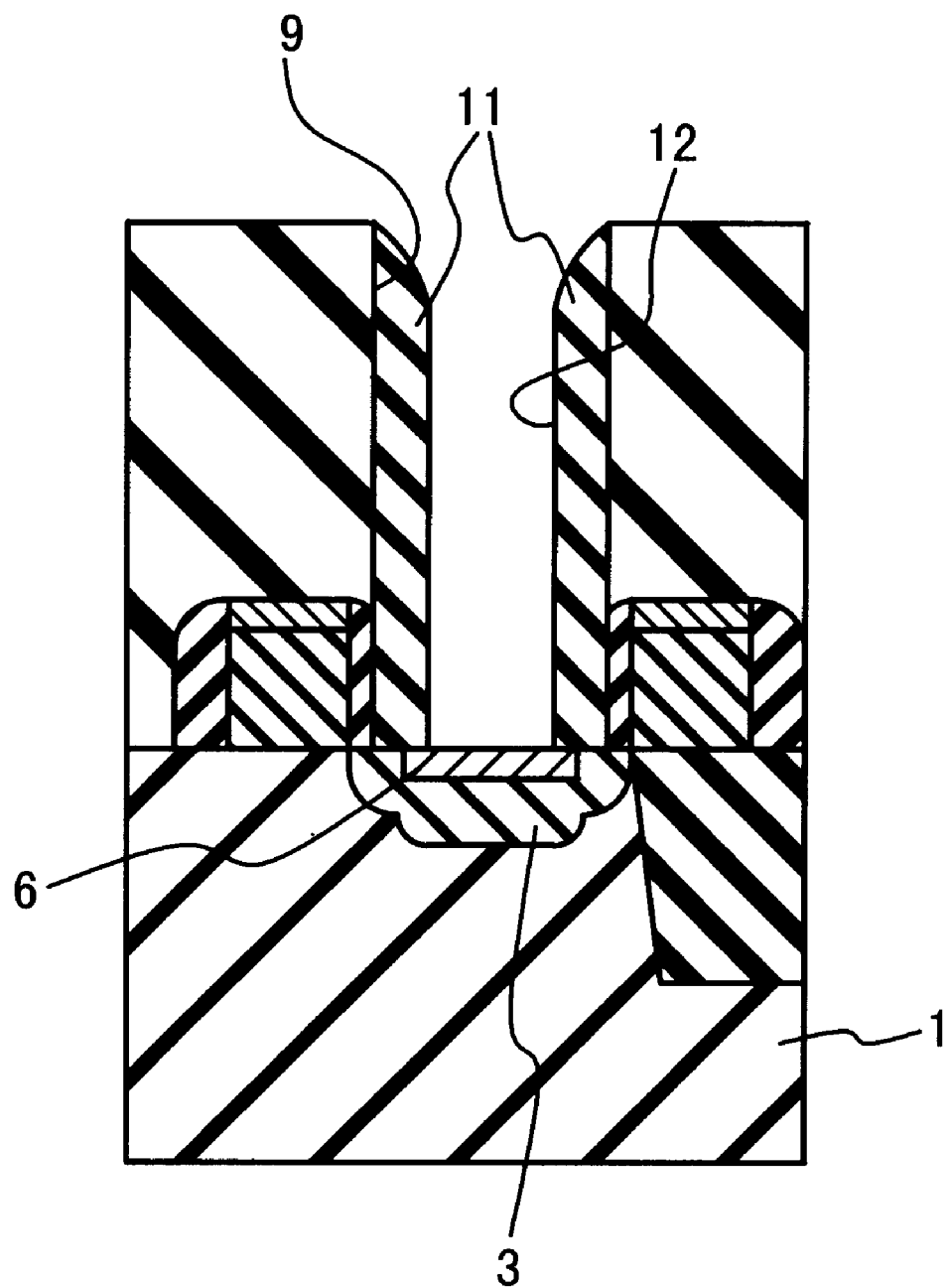
FIG. 4 is a sectional view showing a next step of FIG. 3.

Next, as shown in FIG. 4, a side wall 11 is formed on an inner surface of the contact hole 9. Typically, it is necessary to minimize the margin between the contact and the gate in order to make a cell size small. Also, the contact size is determined in accordance with a resolution of a lithography of the generation. Typically, the side wall 11 is additionally formed in order to attain the small size equal to or less than the resolution limit. The formation of the side wall 11 enables a contact hole 12 having a narrower width to be newly formed.

After the additional formation of the side wall 11, wet etching process is performed as a preliminary process by using chemical solution of hydrofluoric acid system, in order to remove a natural oxide film formed on a bottom surface of the contact hole 12. This process is referred to as a washing process and a preliminary process before growth of the polysilicon.

The polysilicon doped with the impurity is embedded in the contact hole 12 at a later-described step. Accordingly, a contact plug 16 is formed. In this embodiment, only the cobalt silicide layer 6 under the contact plug 16 is removed in the self-alignment manner, as described later.

Usually, making a time of the preliminary process longer can remove not only the natural oxide film but also the cobalt silicide layer 6. However, if the time of the preliminary process is made longer, the film reduction of the side wall 11 serving as the contact side wall is caused at the same time. It leads to a short between the gate 2 and the contact plug 16.

Figure 5:
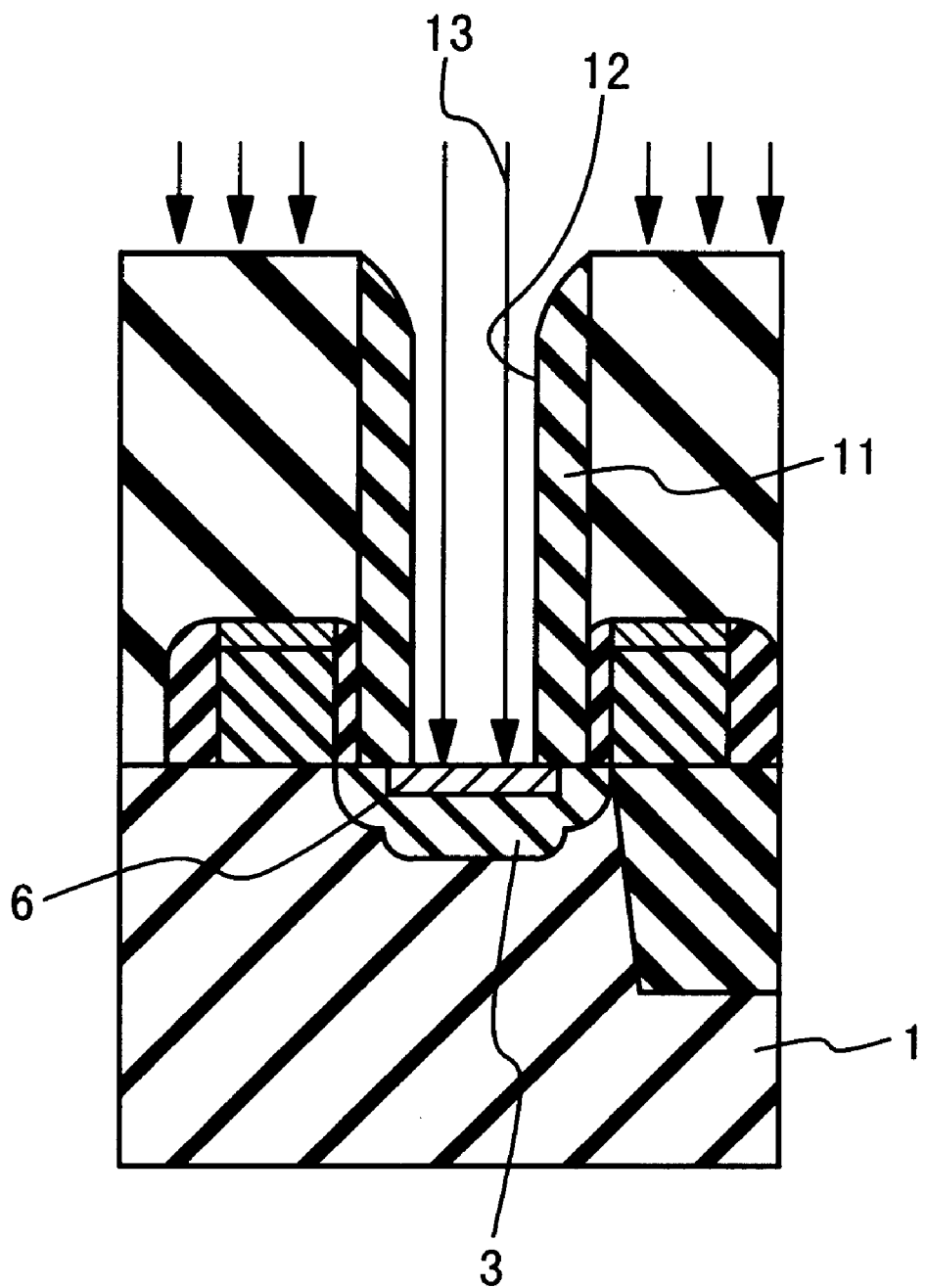
FIG. 5 is a sectional view showing a next step of FIG. 4.

So, this embodiment provides a method in which the cobalt silicide layer 6 can be removed within a normal (not longer) time of the normal preliminary process. That is, as shown in FIG. 5, an ion implantation 13 is performed before the preliminary process after the formation of the contact hole 12. The ion implantation 13 changes the cobalt silicide layer 6 to amorphous to thereby deteriorate the wet etching resistivity of the cobalt silicide layer 6. Accordingly, only the cobalt silicide layer 6 immediately beneath the contact plug 16 (immediately beneath the contact hole 12) can be removed without making the time of the preliminary process longer than that of the normal preliminary process.

Figure 6:
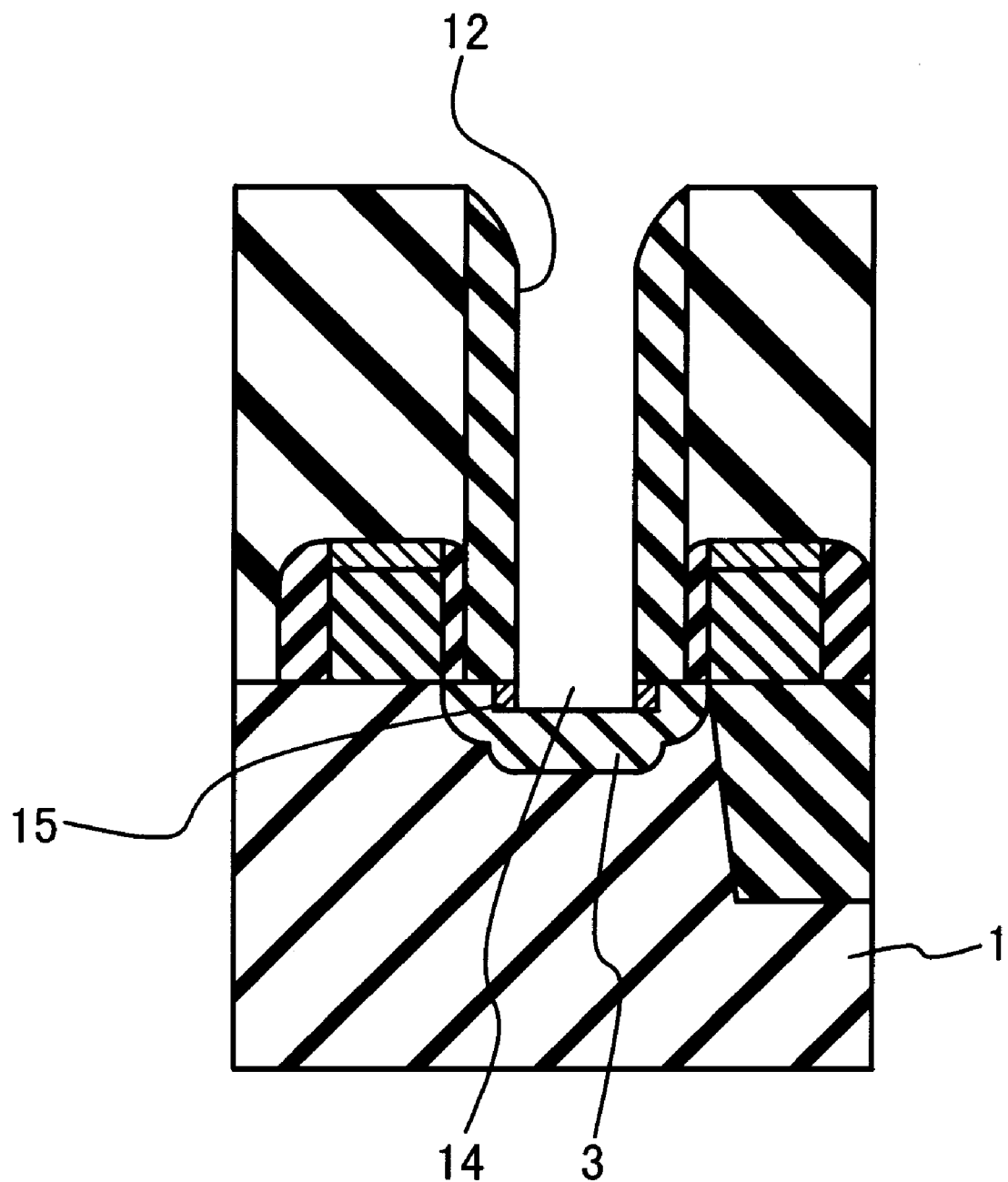
FIG. 6 is a sectional view showing a next step of FIG. 5.

That is, as shown in FIG. 6, the preliminary process is performed within the normal time of the normal preliminary process to then remove the cobalt silicide layer 6. Accordingly, this can solve the problem of the film reduction of the side wall 11. As shown in FIG. 6, only the cobalt silicide layer 6 immediately beneath the contact hole 12 is removed in the self-alignment manner such that a removal section 14 is formed and a remaining section 15 remains.

As mentioned above, the reduction of the manufacturing cost can be attained by removing the step of forming a silicide block PR. In an actual step, it is desirable that the ion implantation 13 is performed, after the contact hole 12 is formed, such that the cobalt silicide layer 6 is changed to amorphous, and after the ion implantation 13, the preliminary process is performed. In the ion implantation 13, an ion implantation condition (energy and dose amount) is selected at a level at which it can sufficiently change the cobalt silicide layer 6 to amorphous and it has no influence on the performance of the transistor device.

If an implanted ion is arsenic in the ion implantation 13, it is desirable that a kinetic (implantation) energy of the ion is 20 to 50 KeV, and a dose amount is $1 \times 10^{14}$ to $1 \times 10^{15}$. If the implanted ion is phosphorus in the ion implantation 13, it is desirable that an implantation energy of the ion is 20 to 50 KeV, and a dose amount is $1 \times 10^{14}$ to $5 \times 10^{15}$.

Figure 7:
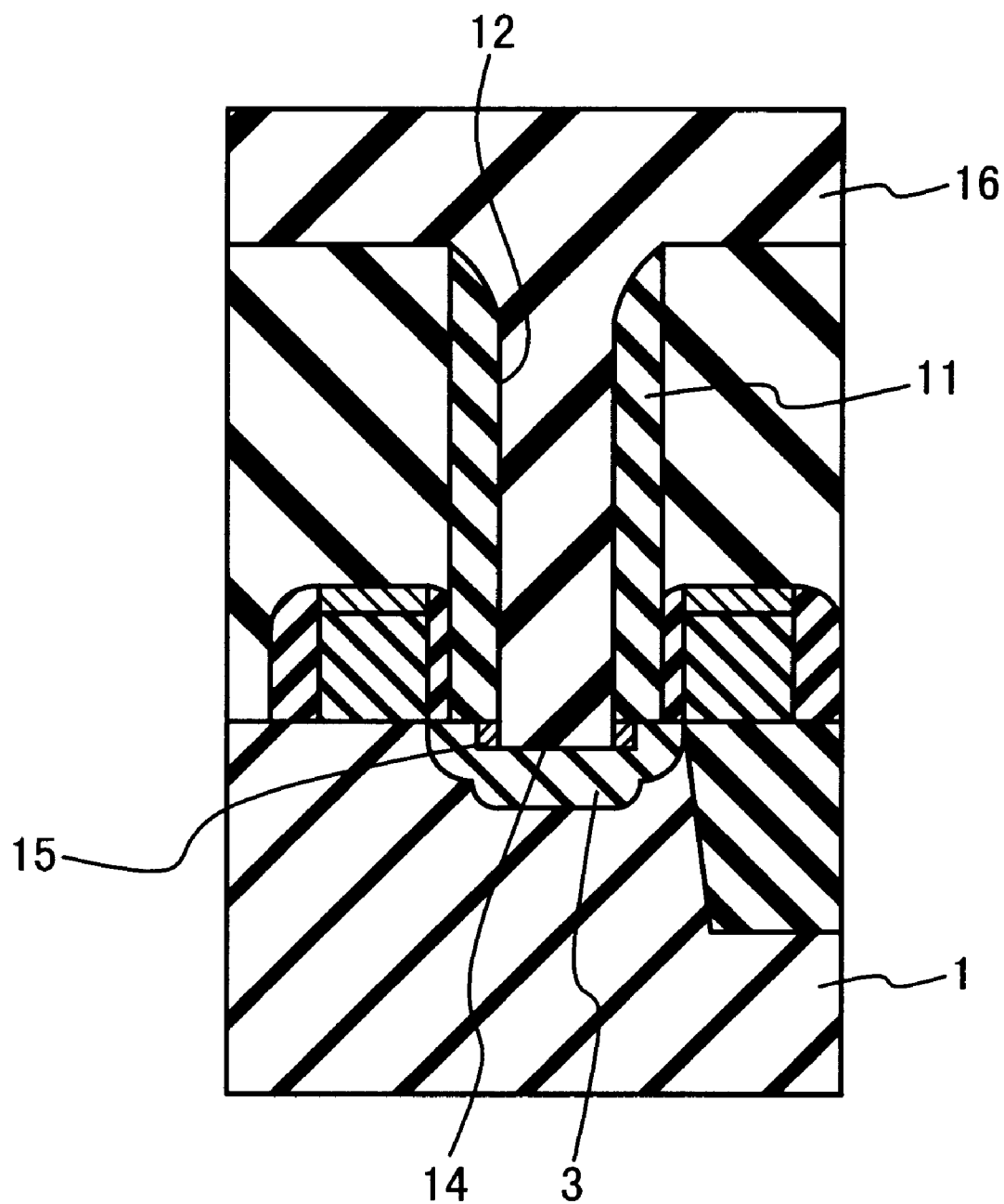
FIG. 7 is a sectional view showing a next step of FIG. 6.

After the step of the preliminary process of FIG. 6, the polysilicon layer 16 doped with the impurity is embedded in the contact hole 12, as shown in FIG. 7. The polysilicon layer 16 is formed as the contact plug. Only the cobalt silicide layer 6 immediately beneath the contact plug 16 is removed in the self-alignment manner.

The silicide layer is not limited to the cobalt silicide. The titanium silicide or the tungsten silicide may be substituted for the cobalt silicide.

Although the contact resistance of the DRAM section before the execution of this embodiment is 10 kΩ to open, the contact resistance of that after the execution of this embodiment is 5 k to 7 kΩ, which implies the improvement of the performance of the DRAM section.

In the conventional method, the transistors of the logic section and the DRAM section must be formed separately so that the number of steps is large. According to this embodiment, even if both the diffusion layer of the logic section and the diffusion layer 3 of the DRAM section are changed to the silicide (FIG. 2), in other words, even if the transistor structures of the logic section and the DRAM section are integrated into a single configuration, the excellent connection between the polysilicon layer 16 and the diffusion layer 3 of the DRAM section can be established by reducing the wet etching resistivity of the silicide layer 6 in the DRAM section and then removing the silicide layer 6 in the normal preliminary process. Thus, the transistors of the logic section and the DRAM section can be formed as the same structure and also they can be formed in the same step. As a result, the silicide block PR needed until now is unnecessary, which enables the number of steps to be largely reduced.

The conventional method requires the four steps of the formation of the gate polysilicon→the silicide block PR→the formation of the silicide→the formation of the contact. On the contrary, according to this embodiment, it can be reduced to the three steps of the formation of the gate polysilicon→the formation of the silicide the formation of the contact.

The method of manufacturing a semiconductor device according to the present invention can maintain the performance of the semiconductor device and also reduce the cost.

What is claimed is:

1. A method of manufacturing a semiconductor device, comprising:
   (f) providing a DRAM section and a logic section in a substrate;
   (g) forming a first diffusion layer in said DRAM section and a second diffusion layer in said logic section;
   (h) forming a first silicide layer in said first diffusion layer and a second silicide layer in said second diffusion layer;
   (i) removing said first silicide layer to expose said first diffusion layer; and
   (j) forming a contact plug such that said contact plug is connected to said exposed first diffusion layer directly.

2. A method of manufacturing a semiconductor device according to claim 1, wherein said (i) step includes removing said first silicide layer such that said first silicide layer corresponding to a lower portion of said contact plug is removed in self alignment process.

3. A method of manufacturing a semiconductor device according to claim 1, wherein said (h) step includes forming said first silicide layer in said first diffusion layer, without using a silicide block masking said first diffusion layer not to form a silicide layer in said first diffusion layer.

4. A method of manufacturing a semiconductor device according to claim 1, further comprising:
   (k) forming an interlayer insulating layer on said first silicide layer;
   (l) forming a contact hole in a portion corresponding to said contact plug, of said interlayer insulating layer; and
   (m) forming a side wall on an inner surface of said contact hole to form a second contact hole, and
   wherein said (i) step includes removing said first silicide layer exposed through said second contact hole in self alignment process.

5. A method of manufacturing a semiconductor device according to claim 4, wherein said (j) step includes forming said contact plug in said second contact hole.

6. A method of manufacturing a semiconductor device according to claim 4, wherein said (i) step includes removing said first silicide layer by wet etching such that said side wall is not removed by said wet etching.

7. A method of manufacturing a semiconductor device according to claim 6, wherein said wet etching is performed to remove a native oxide on a bottom surface of said second contact hole.

8. A method of manufacturing a semiconductor device according to claim 4, wherein said (i) step includes performing ion implantation on said first silicide layer exposed through said second contact hole.

9. A method of manufacturing a semiconductor device according to claim 8, wherein said ion implantation is performed to change to amorphous, said first silicide layer exposed through said second contact hole.

10. A method of manufacturing a semiconductor device according to claim 9, wherein said (i) step includes removing said first silicide layer changed to amorphous by said wet etching.

11. A method of manufacturing a semiconductor device according to claim 8, wherein said ion implantation is performed to decrease a wet etching resistivity of said first silicide layer exposed through said second contact hole.

12. A method of manufacturing a semiconductor device according to claim 1, wherein said first and second silicide layers are formed of one of cobalt silicide, titanium silicide and tungsten silicide.

13. A method of manufacturing a semiconductor device according to claim 1, wherein a contact resistance of said DRAM section is 5 k to 7 kΩ.

14. A method of manufacturing a semiconductor device according to claim 8, wherein when said implanted ion is arsenic, said ion implantation is performed in a condition that an implantation energy of the ion is 20 to 50 KeV and a dose amount is $1 \times 10^{14}$ to $1 \times 10^{15}$.

15. A method of manufacturing a semiconductor device according to claim 8, wherein when said implanted ion is phosphorus, said ion implantation is performed in a condition that an implantation energy of the ion is 20 to 50 KeV and a dose amount is $1 \times 10^{14}$ to $5 \times 10^{15}$.

16. A method of manufacturing a semiconductor device, comprising the steps of:
   providing a DRAM section and a logic section in a substrate;
   forming a first silicide layer in said DRAM section and a second silicide layer in said logic section;
   forming a gate layer in said DRAM section adjacent to said first silicide layer;
   forming side walls on portions of said gate layer that oppose each other across said first silicide layer;
   changing to amorphous a part of said first silicide layer that is exposed between said side walls; and
   removing the amorphous part of said first silicide layer.

17. The method of claim 16, wherein the step of changing said first silicide layer to amorphous comprises the step of ion implanting said first silicide layer.

18. The method of claim 17, wherein the ion implanting step comprises implanting arsenic ions at an implantation energy of 20 to 50 KeV and with a dose amount of $1 \times 10^{14}$ to $1 \times 10^{15}$.

19. The method of claim 17, wherein the ion implanting step comprises implanting phosphorus ions at an implantation energy of 20 to 50 KeV and with a dose amount of $1 \times 10^{14}$ to $5 \times 10^{15}$.

20. The method of claim 16, wherein the step of removing the amorphous part of said first silicide layer comprises wet the step of etching.

21. The method of claim 16, wherein the step of forming the first silicide layer comprises the step of forming the first silicide layer in a diffusion layer in a substrate of the device.

22. A method of manufacturing a semiconductor device, comprising the steps of:

forming a silicide layer in a substrate;

forming a gate layer adjacent to said silicide layer;

forming side walls on portions of said gate layer that oppose each other across said silicide layer;

ion implanting a part of said silicide layer that is exposed between said side walls to change the part to amorphous and reduce the part's etching resistivity; and etching away the amorphous part of said silicide layer.

23. The method of claim 22, wherein the step of forming said silicide layer comprises the step of forming said silicide layer in a diffusion layer in the substrate.

\* \* \* \* \*